(12) United States Patent
Chu et al.

(10) Patent No.: US 8,416,576 B2
(45) Date of Patent: Apr. 9, 2013

(54) INTEGRATED CIRCUIT CARD

(75) Inventors: Tse Min Chu, Taoyuan County (TW); Jimmy Liang, Taoyuan County (TW)

(73) Assignee: Aflash Technology Co., Ltd., Luzhu Township, Taoyuan County (TW)

( * ) Notice: Subject to any disclaimer, the term of this patent is extended or adjusted under 35 U.S.C. 154(b) by 284 days.

(21) Appl. No.: 12/796,867

(22) Filed: Jun. 9, 2010

(65) Prior Publication Data

US 2011/0228487 A1 Sep. 22, 2011

(51) Int. Cl.
*H05K 1/14* (2006.01)
*H05K 1/11* (2006.01)

(52) U.S. Cl.
USPC .......................................... 361/737; 174/262

(58) Field of Classification Search .................. None
See application file for complete search history.

(56) References Cited

U.S. PATENT DOCUMENTS

| | | | | |
|---|---|---|---|---|
| 5,006,673 A * | 4/1991 | Freyman et al. | ............ | 174/255 |
| 5,347,159 A * | 9/1994 | Khandros et al. | ............ | 257/692 |
| 5,386,341 A * | 1/1995 | Olson et al. | ................... | 361/749 |
| 5,780,143 A * | 7/1998 | Shimamoto et al. | ......... | 428/209 |
| 5,783,870 A * | 7/1998 | Mostafazadeh et al. | ...... | 257/791 |
| 5,798,564 A * | 8/1998 | Eng et al. | ....................... | 257/686 |
| 5,848,467 A * | 12/1998 | Khandros et al. | ............. | 29/841 |
| 5,901,041 A * | 5/1999 | Davies et al. | ................ | 361/704 |
| 5,915,170 A * | 6/1999 | Raab et al. | .................... | 438/118 |
| 5,950,304 A * | 9/1999 | Khandros et al. | .............. | 29/831 |
| 6,265,782 B1* | 7/2001 | Yamamoto et al. | .......... | 257/783 |
| 6,376,769 B1* | 4/2002 | Chung | .......................... | 174/524 |
| 6,440,542 B1* | 8/2002 | Kariya | .......................... | 428/209 |
| 6,586,843 B2* | 7/2003 | Sterrett et al. | ................ | 257/778 |
| 7,154,046 B2* | 12/2006 | Chung | .......................... | 174/259 |
| 7,484,293 B2* | 2/2009 | Yamaji et al. | .................. | 29/840 |
| 2004/0108600 A1* | 6/2004 | Liang et al. | ................... | 257/778 |
| 2008/0020503 A1* | 1/2008 | Sheats et al. | ................... | 438/34 |
| 2008/0224248 A1* | 9/2008 | Yang et al. | ................... | 257/433 |
| 2009/0047755 A1* | 2/2009 | Yamaji et al. | ................. | 438/121 |
| 2010/0051341 A1* | 3/2010 | Cheng et al. | .................. | 174/261 |
| 2010/0096176 A1* | 4/2010 | Lim et al. | ...................... | 174/262 |
| 2010/0103634 A1* | 4/2010 | Funaya et al. | ................ | 361/761 |

* cited by examiner

*Primary Examiner* — Lisa Lea Edmonds
*Assistant Examiner* — Xanthia C Cunningham
(74) *Attorney, Agent, or Firm* — Muncy, Geissler, Olds & Lowe, PLLC

(57) ABSTRACT

An integrated circuit card includes a laminate, solder bumps, a die and a package. The laminate includes a core board sandwiched between two conductive layers. The conductive layers are connected to each other with solder bumps filled in apertures defined in the core board. The die is provided on one of the conductive layers. The package is provided on the die and an area of the conductive layer around the die.

6 Claims, 12 Drawing Sheets

INTEGRATED CIRCUIT CARD

BACKGROUND OF INVENTION

1. Field of Invention

The present invention relates to an integrated circuit card and, more particularly, to an integrated circuit card made by surface mount technology, not wire bonding.

2. Related Prior Art

Referring to FIGS. 9 through 12, there is shown a conventional integrated circuit ("IC") card 500. The IC card 500 includes a substrate 50, a semiconductor die 60, wires 70 and a package 80.

Referring to FIG. 9, the substrate 50 is a laminate including a core board 51 and a conductive layer 53. The core board 51 includes an upper side 511 and a lower side 512. Apertures 52 are defined in the core board 51. The conductive layer 53 is coated on the lower side 512 of the core board 51. Regions of an upper side of the conductive layer 53 are exposed through the apertures 52. A metal finish 55 is coated on each of these regions of the upper side of the conductive layer 53. One of the metal finishes 55 is used as a die-mount pad 55a. The other metal finishes 55 are used as bonding pads 55a. A metal finish 56 is coated on a lower side of the conductive layer 53. Apertures 54 are defined in the conductive layer 53 and the metal finish 56.

Referring to FIG. 10, the semiconductor die 60 is provided on the die-mount pad 55a via adhesive 6.

Referring to FIG. 11, ball pads 61 are provided on an active side of the semiconductor die 60. Each of the ball pads 61 is connected to a related one of the bonding pads 55b through a related one of the wires 70.

Referring to FIG. 12, the package 80 is provided on the upper side 511 of the core board 51 and the bonding pads 55b to seal the semiconductor die 60 and the wires 70. Thus, the conventional IC card 500 is made. The substrate 50 is however expensive since it is made in a proprietary process.

To overcome the foregoing problem, there has been developed a process for making another conventional IC card from a laminate instead of the substrate 50. In the laminate, a circuit provided on a metal layer is connected to a circuit provided on another metal layer by electroplating. Therefore, the laminate is still expensive.

The present invention is therefore intended to obviate or at least alleviate the problems encountered in prior art.

SUMMARY OF INVENTION

It is the primary objective of the present invention to provide an inexpensive IC card.

To achieve the foregoing objective, the integrated circuit card includes a laminate, solder bumps, a semiconductor die and a package. The laminate includes a core board, first and second conductive layers, a solder resist and metal finishes. Apertures are defined in the core board. The first conductive layer is coated on an upper side of the core board and made with apertures. Some of the apertures of the first conductive layer are in communication with the apertures of the core board. The second conductive layer is coated on a lower side of the core board. The solder resist is coated on the first conductive layer and made with apertures in communication with the apertures of the first conductive layer. Some of the metal finishes are coated on regions of the first conductive layer exposed through the apertures of the solder resist. The other metal finishes are coated on regions of the second conductive layer exposed through the apertures of the core board. Some of the solder bumps are provided on the metal finishes located in the apertures of the solder resist that are not in communication with the apertures of the core board, and each of them includes a die-mount face. The other solder bumps are provided on the metal finishes located in the apertures of the solder resist that are in communication with the apertures of the core board and the metal finishes located in the apertures of the core board. The semiconductor die is provided on the die-mount faces. The package is provided on the semiconductor die and a region of the solder resist around the semiconductor die.

Other objectives, advantages and features of the present invention will be apparent from the following description referring to the attached drawings.

BRIEF DESCRIPTION OF DRAWINGS

The present invention will be described via detailed illustration of the preferred embodiment versus prior art referring to the drawings wherein.

DETAILED DESCRIPTION OF PREFERRED EMBODIMENT

Figure 1:
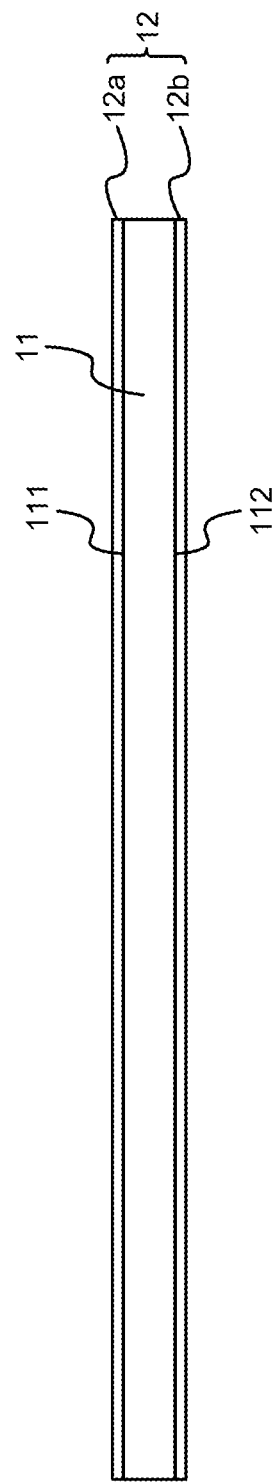
FIG. 1 is a cross-sectional view of a core board sandwiched between two conductive layers of an integrated circuit card according to the preferred embodiment of the present invention.

Referring to FIGS. 1 through 8, there is shown a process for making an integrated circuit ("IC") card 100 according to the preferred embodiment of the present invention. The IC card 100 includes a substrate 10, solder bumps 20, a semiconductor die 30 and a package 40.

Referring to FIG. 1, the substrate 10 is a laminate including a core board 11 and upper and lower metal layers 12. The core board 11 includes an upper side 111 and a lower side 112. The upper and lower metal layers 12 are preferably made of copper. The upper metal layer 12 is coated on the upper side 111 of the core board 11 while the lower metal layer 12 is coated on the lower side 112 of the core board 11. The upper metal layer 12 is turned into a first conductive layer 12a by etching for example. Similarly, the lower metal layer 12 is turned into a second conductive layer 12b.

Figure 2:
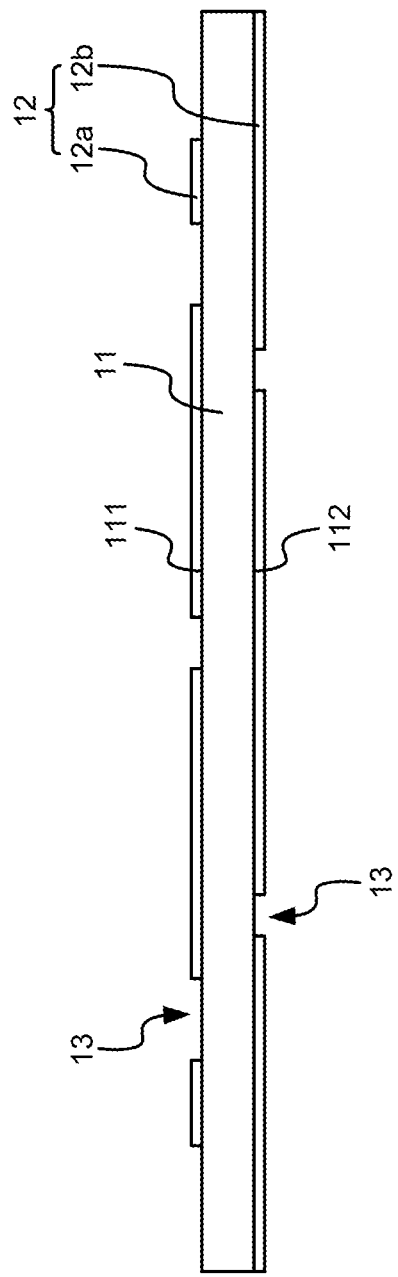
FIG. 2 is a cross-sectional view showing apertures made in the conductive layers shown in FIG. 1.

Referring to FIG. 2, apertures 13 are defined in each of the first and second conductive layers 12a and 12b by etching for example. Regions of the upper side 111 of the core board 11 are exposed through the apertures 13 defined in the first conductive layer 12a. Regions of the lower side 112 of the core board 11 are exposed through the apertures 13 defined in the second conductive layer 12b.

Figure 3:
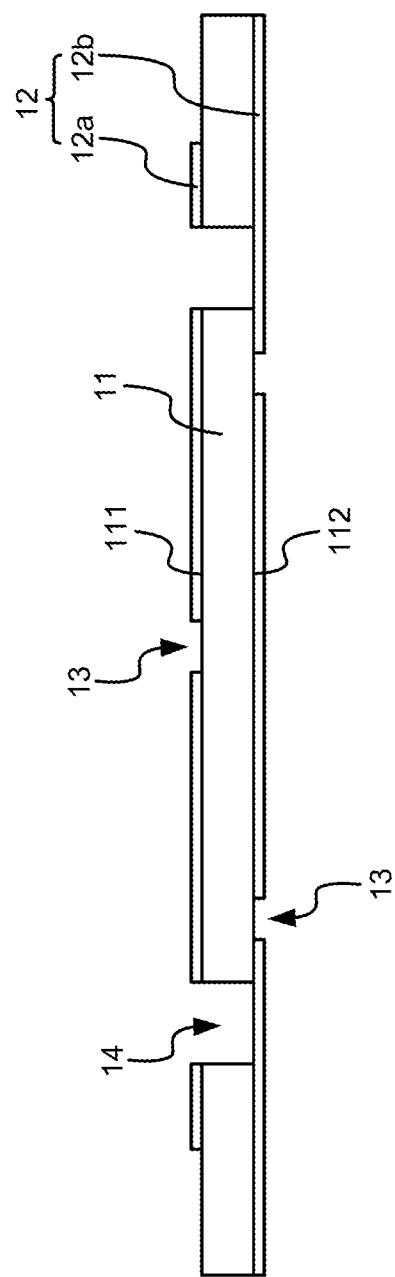
FIG. 3 is a cross-sectional view showing apertures made in the core board shown in FIG. 2.

Referring to FIG. 3, apertures 14 are defined in the core board 11 by laser drilling for example. The upper metal layer 12 can be electrically connected to the second conductive layer 12b through the apertures 14.

Figure 4:
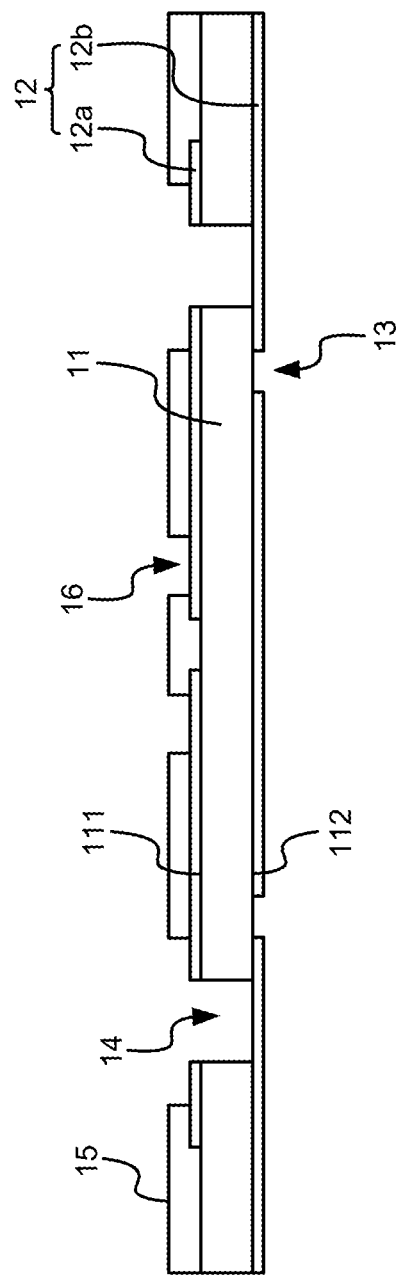
FIG. 4 is a cross-sectional view showing apertures made in a solder resist provided on the core board and one of the conductive layers shown in FIG. 3.

Referring to FIG. 4, a solder resist 15 is coated on the first conductive layer 12. Apertures 16 are defined in the solder resist 15. Regions of an upper side of the first conductive layer 12a are exposed via the apertures 16. Some of the apertures 16 are in communication with some of the apertures 14. Regions of an upper side of the second conductive layer 12b are exposed through the aligned apertures 16 and 14.

Figure 5:
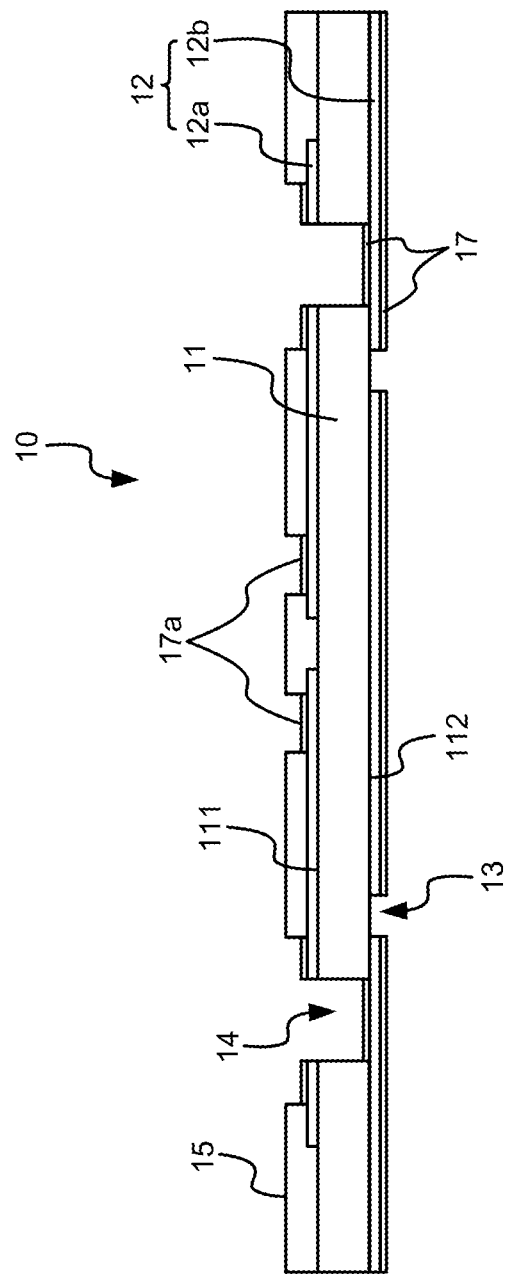
FIG. 5 is a cross-sectional view of metal finishes located in the apertures of the core board and the apertures of the solder resist shown in FIG. 4.

Referring to FIG. 5, a metal finish 17 is coated on each of the regions of the upper side of the first conductive layer 12a exposed through some of the apertures 16 that are not aligned with the apertures 14. Each of these metal finishes 17 is used as a ball pad 17a. A metal finish 17 is coated on each of the regions of the upper side of the first conductive layer 12a exposed through the other apertures 16. A metal finish 17 is coated on each of the regions of the upper side of the second conductive layer 12b exposed through the apertures 14. A metal finish 17 (the "lower metal finish 17") is coated on the lower side of the second conductive layer 12b. Apertures are defined in the lower metal finish 17 corresponding to the apertures 13 defined in the second conductive layer 12b. The metal finishes 17 are chemical nickel-gold layers, electroplated nickel-gold layers, immersed silver layers or organic solderability preservative layers ("OSP") to avoid erosion and deterioration.

Figure 6:
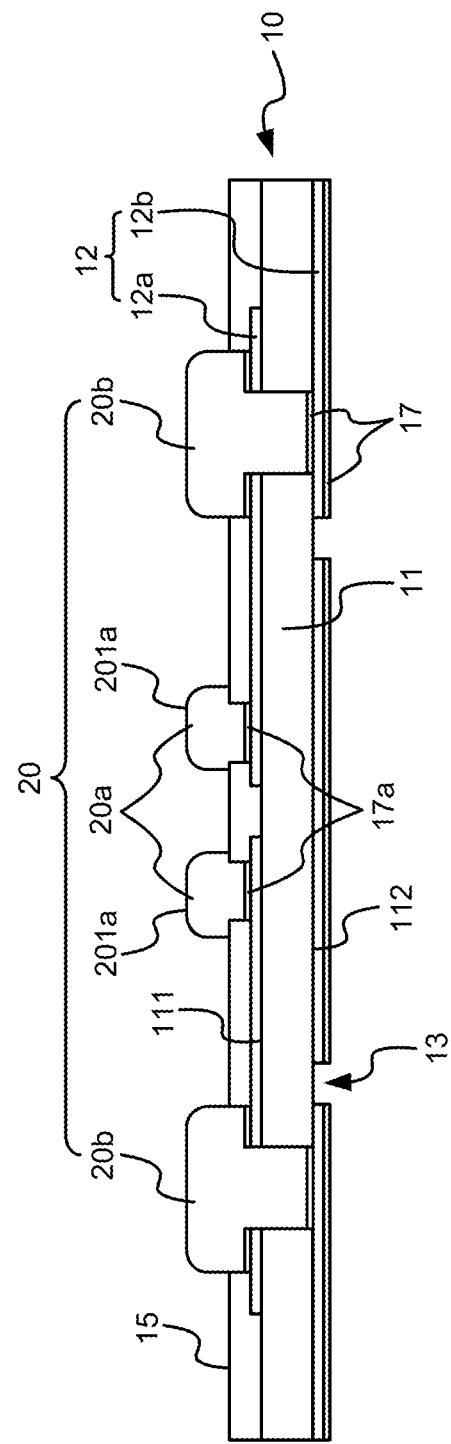
FIG. 6 is a cross-sectional view of solder bumps provided on the metal finishes shown in FIG. 5.

Referring to FIG. 6, the solder bumps 20 are provided on the ball pads 17a by printing for example. Some of the solder bumps 20 (the "solder bumps 20a") are filled in some of the apertures 16 that are not aligned with the apertures 14 to cover the ball pads 17a. Each of the solder bumps 20a includes a die-mount face 201a. The other solder bumps 20 (the "solder bumps 20b") are filled in the aligned apertures 16 and 14.

Figure 7:
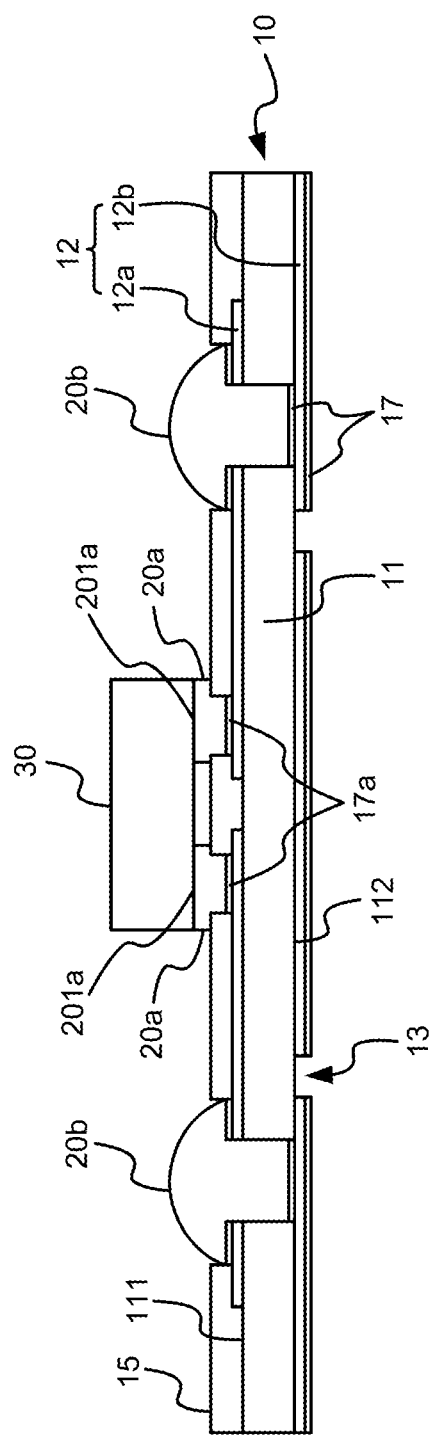
FIG. 7 is a cross-sectional view of a die provided on some of the solder bumps shown in FIG. 6.

Referring to FIG. 7, the semiconductor die 30 is provided on the die-mount faces 201a of the solder bumps 20a by adhesive for example.

Figure 8:
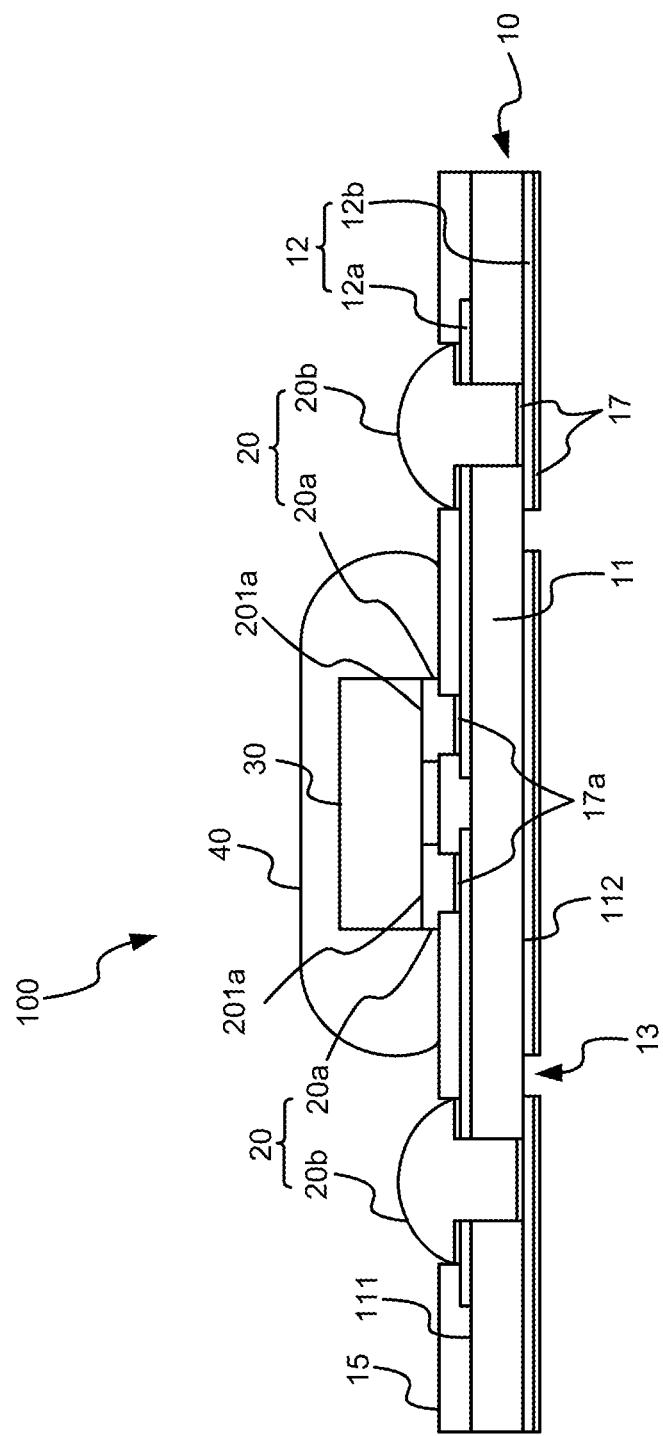
FIG. 8 is a cross-sectional view of a package provided on the die and a region of the solder resist around the die shown in FIG. 7.
Figure 9:
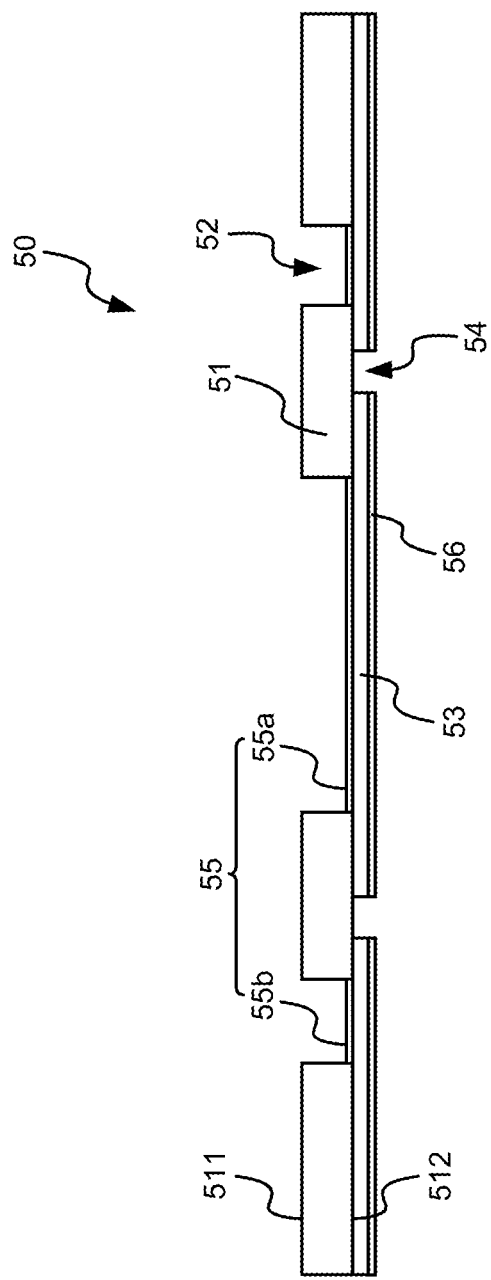
FIG. 9 is a cross-sectional view of a substrate of a conventional integrated circuit card.
Figure 10:
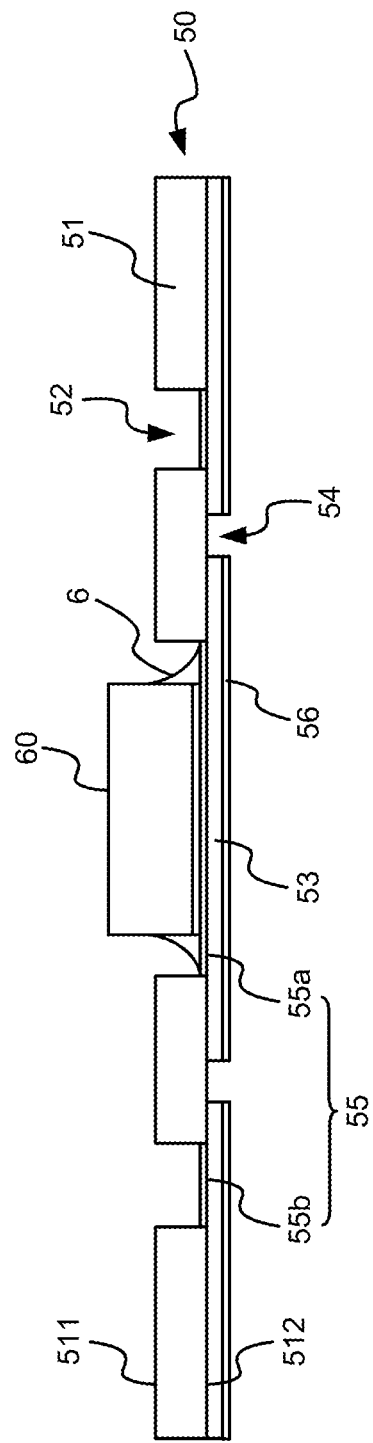
FIG. 10 is a cross-sectional view of a semiconductor die provided on the substrate shown in FIG. 9.
Figure 11:
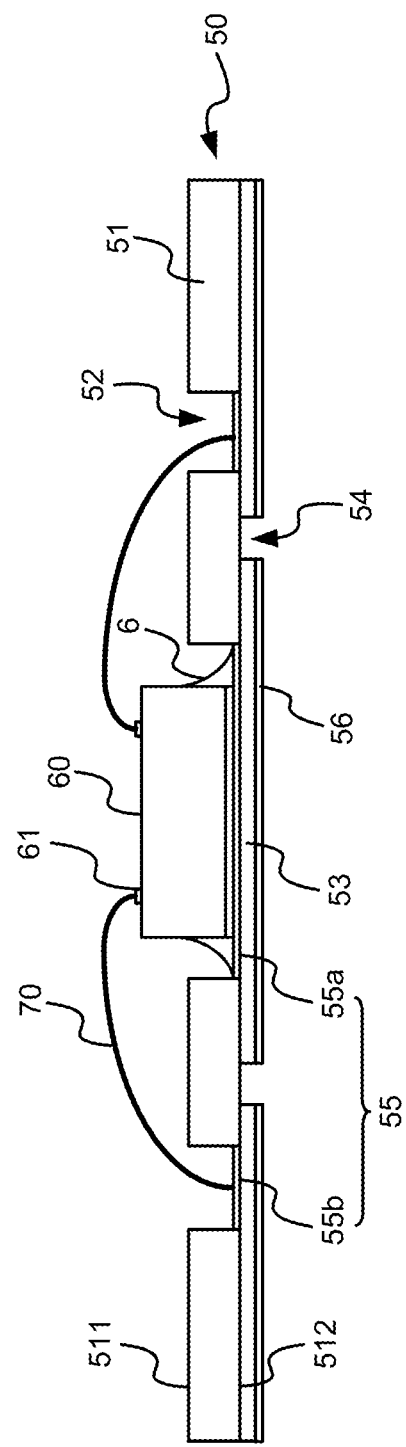
FIG. 11 is a cross-sectional view of wires for connecting the substrate to the semiconductor die shown in FIG. 10.
Figure 12:
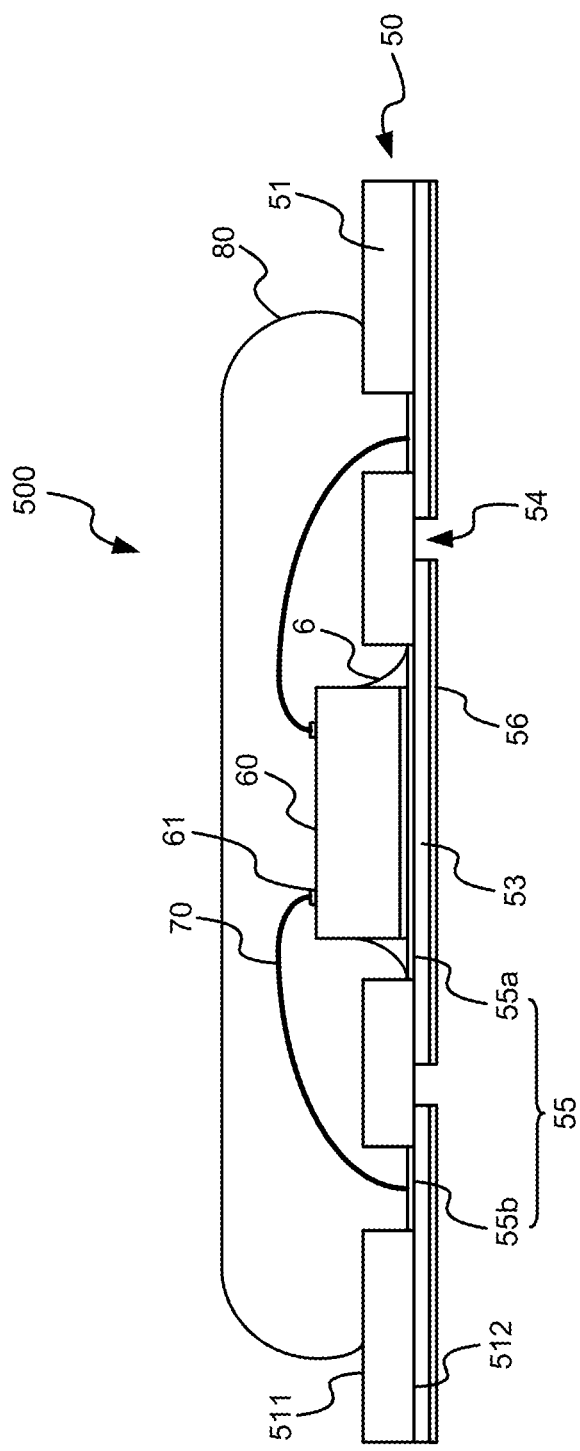
FIG. 12 is a cross-sectional view of a package provided on the substrate, semiconductor die and wires shown in FIG. 11.

Referring to FIG. 8, the package 40 is provided on the die-mount faces 201a of the solder bumps 20a and a region of the upper side of the solder resist 15 around the solder bumps 20a. Thus, the semiconductor die 30 is sealed by the package 40.

Advantageously, the IC card 100 is made of a laminate according to surface mount technology ("SMT") instead of wire bonding. Furthermore, there is no need to use electroplating. The first conductive layer 12a is connected to the second conductive 12b via the solder bumps 20b. Thus, cost of the laminate is low, and the throughput of the packaging is high. Hence, the resultant IC card 100 is inexpensive.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. An integrated circuit card (100) including:
a laminate (10) including:
a core board (11) including an upper side (111), a lower side (112) and a plurality of apertures (14) defined therein from the upper side (111) to the lower side (112);
a first conductive layer (12a) coated on an upper side (111) of the core board (11) and a plurality of apertures (13) are defined in the first conductive layer (12a), wherein some of the apertures (13) of the first conductive layer (12a) are in communication with the apertures (14) of the core board (11);
a second conductive layer (12a) coated on a lower side (112) of the core board (11);
a solder resist (15) coated on the first conductive layer (12a) and a plurality of apertures (16) are defined in the solder resist (15), wherein some of the apertures (16) are in communication with some of the apertures (14), wherein some regions of an upper side of the first conductive layer (12a) are exposed via the apertures (16);
an upper metal finish (17a) coated on each of the regions of the upper side of the first conductive layer (12a) exposed through some of the apertures (16) that are not aligned with the apertures (14), wherein each of these metal finishes (17a) is used as a ball pad (17a), wherein the upper metal finish (17) also coated on each of the regions of the upper side of the first conductive layer (12a) exposed through the other apertures (16); and
a lower metal finish (17) coated on regions of the second conductive layer (12b) exposed through the apertures (14) of the core board (11);
a solder bump (20a) provided on each of the upper metal finishes (17a) located in the apertures (16) of the solder resist (15) that are not in communication with the apertures (14) of the core board (11), wherein each of the solder bumps (20a) includes a die-mount face (201a); and
a solder bump (20b) provided on each of the lower metal finishes (17) located in the apertures (16) of the solder resist (15) that are in communication with the apertures (14) of the core board (11) and the upper metal finishes (17) located in the apertures (14) of the core board (11);
wherein the solder bumps (20a) and the solder bumps (20b) are made simultaneously via one printing step;
a semiconductor die (30) provided on the die-mount faces (201a); and
a package (40) provided on the semiconductor die (30) and a region of the solder resist (15) around the semiconductor die (30).

2. The integrated circuit card according to claim 1, wherein the apertures (14) of the core board (11) are made by laser drilling.

3. The integrated circuit card according to claim 1, wherein the first and second conductive layers (12a) and (12b) are made of copper.

4. The integrated circuit card according to claim 1, wherein the metal finishes (17) are selected from the group consisting of chemical nickel-gold layers, electroplated nickel-gold layers, immersed silver layers and organic solderability preservative layers to avoid erosion and deterioration.

5. The integrated circuit card according to claim 1, wherein the conductive layers (12a) and (12b) are made of metal by etching.

6. A method for manufacturing an integrated circuit card (100) including the following steps:
providing a laminate (10), the laminate (10) includes a core board (11), an upper metal layers (12) coated on the upper side (111) of the core board (11) and an lower metal layer (12) coated on the lower side (112) of the core board (11);

making the upper metal layer (12) turned into a first conductive layer (12a) and the lower metal layer (12) turned into a second conductive layer (12b);

forming a plurality of apertures (13) defined in each of the first and second conductive layers (12a, 12b), wherein some regions of the upper side (111) of the core board (11) are exposed through the apertures (13) defined in the first conductive layer (12a), and some regions of the lower side (112) of the core board (11) are exposed through the apertures (13) defined in the second conductive layer (12b);

forming a plurality of apertures (14) defined in the core board (11) from the upper side (111) to the lower side (112), wherein some of the apertures (13) of the first conductive layer (12a) are in communication with the apertures (14) of the core board (11) so that the first conductive layer (12a) can be electrically connected to the second conductive layer (12b) through the apertures 14;

forming a solder resist (15) coated on the first conductive layer (12a) and a plurality of apertures (16) defined in the solder resist (15), wherein some of the apertures (16) are in communication with some of the apertures (14), wherein some regions of an upper side of the first conductive layer (12a) are exposed via the apertures (16);

forming an upper metal finish (17a) coated on each of the regions of the upper side of the first conductive layer (12a) exposed through some of the apertures (16) that are not aligned with the apertures (14), wherein each of these metal finishes (17a) is used as a ball pad (17a), wherein the upper metal finish (17) also coated on each of the regions of the upper side of the first conductive layer 12a exposed through the other apertures 16; and forming a lower metal finish (17) coated on regions of the second conductive layer (12b) exposed through the apertures (14) of the core board (11);

forming a plurality of solder bumps (20a) and a plurality of solder bumps (20b) simultaneously via once printing step, wherein the solder bump (20a) on each of the metal finishes (17a) located in the apertures (16) of the solder resist (15) that are not in communication with the apertures (14) of the core board (11), wherein each of the solder bumps (20a) includes a die-mount face (201a); wherein the solder bump (20b) provided on each of the metal finishes (17) located in the apertures (16) of the solder resist (15) that are in communication with the apertures (14) of the core board (11) and the metal finishes (17) located in the apertures (14) of the core board (11);

providing a semiconductor die (30) on the die-mount faces (201a) by surface mount technology; and providing a package (40) on the semiconductor die (30).

* * * * *